United States Patent
Tylaite et al.

(10) Patent No.: US 11,936,178 B2
(45) Date of Patent: Mar. 19, 2024

(54) ESD PROTECTION DEVICE WITH REDUCED HARMONIC DISTORTION

(71) Applicant: Infineon Technologies AG, Neubiberg (DE)

(72) Inventors: Egle Tylaite, Munich (DE); Joost Adriaan Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 413 days.

(21) Appl. No.: 17/027,226

(22) Filed: Sep. 21, 2020

(65) Prior Publication Data

US 2022/0094158 A1    Mar. 24, 2022

(51) Int. Cl.
*H02H 9/04* (2006.01)
*H01L 27/02* (2006.01)

(52) U.S. Cl.
CPC ......... *H02H 9/046* (2013.01); *H01L 27/0288* (2013.01)

(58) Field of Classification Search
CPC ...... H02H 9/046; H02H 9/04; H01L 27/0288; H01L 27/0255; H01L 27/0248; H01L 23/62; H01L 23/642
See application file for complete search history.

(56) References Cited

U.S. PATENT DOCUMENTS

| | | | |
|---|---|---|---|
| 2010/0244090 A1* | 9/2010 | Bobde | H01L 27/0817 257/E29.335 |
| 2014/0160607 A1 | 6/2014 | Reimann et al. | |
| 2014/0167101 A1* | 6/2014 | Bobde | H01L 27/0259 257/146 |
| 2019/0051644 A1* | 2/2019 | Ueki | H01L 27/0814 |
| 2019/0123553 A1* | 4/2019 | Ueki | H02H 9/04 |
| 2019/0319025 A1* | 10/2019 | Ueki | H01L 29/866 |
| 2020/0051968 A1 | 2/2020 | Willemen | |
| 2021/0036041 A1* | 2/2021 | Miyamoto | H01L 27/14636 |

FOREIGN PATENT DOCUMENTS

| | | |
|---|---|---|
| CN | 109326592 B | 8/2020 |
| CN | 111668211 A | 9/2020 |

OTHER PUBLICATIONS

Wikipedia—Impedance matching (https://en.wikipedia.org/wiki/Impedance_matching) (Year: 2023).*

* cited by examiner

*Primary Examiner* — Hoai V Pham
(74) *Attorney, Agent, or Firm* — Murphy, Bilak & Homiller, PLLC (57) ABSTRACT

An overvoltage protection device includes first and second semiconductor devices arranged in an anti-serial configuration with a conductive link connected between the first and second semiconductor devices at a central node of the overvoltage protection device, a first terminal connection to a terminal of the first semiconductor device that is opposite from the central node, a second terminal connection to a terminal of the second semiconductor device that is opposite from the central node. A total capacitance of elements in a first transmission path that is between the first terminal connection and the central node substantially matches a total capacitance of elements in a second transmission path that is between the second terminal connection and the central node. The total capacitance of elements in the second transmission path includes a self-capacitance of the conductive link.

11 Claims, 10 Drawing Sheets

ESD PROTECTION DEVICE WITH REDUCED HARMONIC DISTORTION

BACKGROUND

ESD (electrostatic discharge) protection devices are used to protect sensitive circuitry from sudden voltage spikes in many types of applications. Examples of these applications include microelectronics, RF electronics, power electronics, and automotive applications. One type of ESD protection device that is popular in many applications is a TVS (transient voltage suppression) device that operates as a clamping device to suppress potentially damaging voltages. Generally speaking, a TVS device can be implemented by any two terminal device which has non-linear capacitive behavior when biased, e.g., diode, capacitor, etc. While TVS devices offer advantages in comparison to other types of protection devices such as minimal overshoot and low cost, they have certain drawbacks. For example, in RF applications wherein electromagnetic compatibility is an important design consideration, non-linear electrical device characteristics of TVS devices can cause the emission of spurious signals due to generation of harmonic signals and intermodulation distortion. It would be desirable to provide a semiconductor-based ESD protection device at low cost with improved linearity and thus reduced harmonics generation.

SUMMARY

An overvoltage protection device is disclosed. According to an embodiment, the overvoltage protection device comprises first and second semiconductor devices arranged in an anti-serial configuration with a conductive link connected between the first and second semiconductor devices at a central node of the overvoltage protection device, a first terminal connection to a terminal of the first device that is opposite from the central node, a second terminal connection to a terminal of the second device that is opposite from the central node, wherein a total capacitance of elements in a first transmission path that is between the first terminal connection and the central node substantially matches a total capacitance of elements in a second transmission path that is between the second terminal connection and the central node, and wherein the total capacitance of elements in the second transmission path comprises at least a portion of a self-capacitance of the conductive link.

Separately or in combination, the total capacitance of elements in the second transmission path further comprises an inherent capacitance of the second semiconductor device, and the total capacitance of elements in the first transmission path comprises an inherent capacitance of the first diode.

Separately or in combination, the inherent capacitance of the first diode substantially matches the inherent capacitance of the second semiconductor device, the overvoltage protection device further comprises an additional capacitance in the first transmission path, and the additional capacitance substantially matches the self-capacitance of the conductive link.

Separately or in combination, the first and second semiconductor devices and the additional capacitance are each monolithically integrated in a semiconductor die.

Separately or in combination, the first transmission path comprises one or more sections of conductive material, the second transmission path comprises one or more sections of conductive material, and the additional capacitance is provided by a geometric difference between the one or more sections of conductive material which form the capacitance between the first terminal and the central node of the first transmission path and the one or more sections of conductive material which form the capacitance between the first terminal and the central node of the second transmission path.

Separately or in combination, the one or more sections of metallization from the first transmission path comprise a first metal electrode that is disposed on a surface of the semiconductor die, the one or more sections of metallization from the second transmission path comprise a second metal electrode that is disposed on a surface of the semiconductor die, and the geometric difference comprises a size difference between the first and second metal electrodes.

Separately or in combination, the size difference between the first and second metal electrodes is such that a pad capacitance of the first metal electrode between the first electrode and the central node is greater than a pad capacitance of the second metal electrode between the second electrode and the central node by an amount equal to the additional capacitance.

Separately or in combination, the one or more sections of metallization from the first transmission path comprise a first interconnect line that is formed within the semiconductor die, the one or more sections of metallization from the second transmission path comprise a second interconnect line that is formed within the semiconductor die, and the geometric difference comprises a difference in geometry between the first and second interconnect lines Separately or in combination, the additional capacitance is a dielectric-based or semiconductor-based capacitor structure that is separate from the first diode and connected between the first terminal and the central node.

Separately or in combination, the inherent capacitance of the first diode is greater than the inherent capacitance of the second semiconductor device by an amount equal to the self-capacitance of the conductive link.

According to another embodiment, the overvoltage protection device comprises a semiconductor die, first and second semiconductor devices that are monolithically integrated in the semiconductor die and arranged in an anti-serial configuration with a conductive link connected between the first and second semiconductor devices at a central node of the overvoltage protection device, a first conductive electrode connected to a terminal of the first diode that is opposite from the central node, a second conductive electrode connected to a terminal of the second semiconductor device that is opposite from the central node, a monolithically integrated feature of the semiconductor die that compensates for a parasitic capacitance of the overvoltage protection device such that the capacitances of the overvoltage protection device between the first metal electrode and the second bond pad under operation are substantially symmetrical with respect to the central node.

Separately or in combination, the parasitic capacitance comprises at least a portion of self-capacitance of the conductive link.

Separately or in combination, the monolithically integrated feature forms a capacitance in the first transmission path between the central node and the second terminal which substantially matches the self-capacitance of the conductive link.

Separately or in combination, the monolithically integrated feature comprises the first conductive electrode and the second conductive electrode, and wherein the first metal electrode is larger than the second metal electrode.

Separately or in combination, the monolithically integrated feature is integrally formed in a semiconductor body of the semiconductor die A semiconductor assembly is disclosed. According to an embodiment, the semiconductor assembly comprises a circuit carrier comprising first and second planar die mounting pads, an overvoltage protection device mounted on the circuit carrier and comprising first and second semiconductor devices arranged in an anti-serial configuration with a conductive link connected between the first and second semiconductor devices at a central node of the overvoltage protection device, the first and second semiconductor devices each being two terminal semiconductor devices with one way conduction characteristics, wherein a first terminal of the overvoltage protection device is attached and electrically connected to the first die mounting pad, wherein a second terminal of the overvoltage protection device is attached and electrically connected to the second die mounting pad, wherein a first transmission path exists between the second planar die mounting pad and the central node and a second transmission path exists between the second planar die mounting pad and the central node, wherein a self-capacitance of the conductive link contributes to a total capacitance of the second transmission path during operation of the overvoltage protection device, wherein the overvoltage protection device further comprises an additional capacitance in the first transmission path, and wherein the additional capacitance is greater than the self-capacitance of the conductive link.

Separately or in combination, conductive connections of the circuit carrier to the first metal electrode and the second metal electrode are asymmetric.

Separately or in combination, the additional capacitance substantially matches a sum of the self-capacitance of the conductive link and a fourth net capacitance, wherein fourth net capacitance being a capacitance in the second transmission path during operation of the overvoltage protection device resulting from the asymmetric conductive connections of the circuit carrier.

Separately or in combination, the overvoltage protection device is a single semiconductor die that comprises the first and second semiconductor devices monolithically integrated therein, and the additional capacitance is a monolithically integrated feature of the single semiconductor die.

Separately or in combination, the overvoltage protection device comprises a first semiconductor die that comprises the first semiconductor device monolithically integrated therein and a second semiconductor die that comprises the semiconductor device monolithically integrated therein, wherein the additional capacitance is a monolithically integrated feature of the first or second semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6, which includes

DETAILED DESCRIPTION

An overvoltage protection device is described herein. The overvoltage protection device includes two substantially identical semiconductor device structures that are arranged in an anti-serial configuration. In this configuration, a conductive link (e.g., metal or semiconductor) provides the necessary connection between like terminals of the two devices at a central node. The presence of the parasitic capacitance of the conductive link in the assembly, which cannot be avoided, can cause harmonic distortion in the overvoltage protection device by introducing an asymmetry in the capacitance of the circuit in a typical voltage protection arrangement. The embodiments described herein advantageously compensate for the parasitic capacitance of the conductive link by providing an additional capacitance opposite from the parasitic capacitance with respect to the central node of the circuit. This additional capacitance can be tailored to restore the symmetry of the circuit with respect to the central node in the case that the device is mounted in application system. Several techniques are described herein for providing the additional capacitance as a monolithically formed feature of a semiconductor die or dies. This produces a TVS device with minimal generation of even harmonics distortion at low cost.

Figure 1:
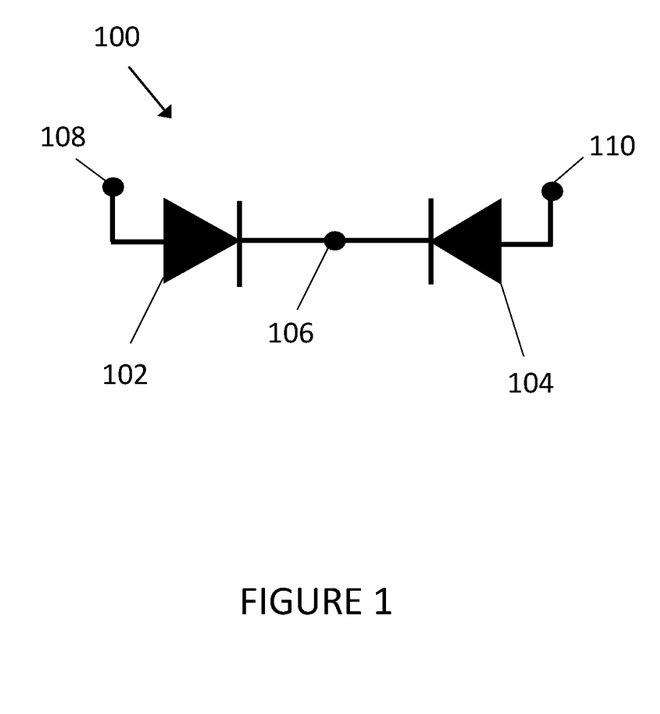
FIG. 1 illustrates a schematic of an overvoltage protection device, according to an embodiment.

Referring to FIG. 1, an overvoltage protection device 100 is schematically depicted. In the depicted embodiment, overvoltage protection device 100 comprises first and second diodes 102, 104 arranged in an anti-serial configuration. In this configuration, like terminals of the first and second diodes 102, 104 connect with one another at a central node 106 of the circuit. In the depicted embodiment, the first and second diodes 102, 104 are arranged such that the cathode terminals of each device connect with one another at the central node 106. In another version of an anti-serial configuration, the polarity of each device is reversed such that the anodes connect with one another. A terminal of the first diode 102 that is opposite from the central node 106 (the anode in the depicted arrangement) forms a first terminal connection 108 and a terminal of the second diode 104 that is opposite from the central node 106 (the anode in the depicted arrangement) forms a second terminal connection 110.

The working principle of the overvoltage protection device 100 is as follows. The overvoltage protection device 100 is designed to permit a voltage applied between first and second terminal connections 108, 110 to vary within a normal operation voltage window of pre-defined positive and negative voltage values which represent voltage limits of safe operation. In the case of a sudden change in voltage that falls outside of the normal operation voltage window, e.g., from an electrostatic discharge event, the overvoltage protection device 100 clamps the voltage to remain at the safe levels. Put another way, the overvoltage protection device 100 becomes conductive in the case of an overvoltage outside of the normal operation voltage window to divert potentially harmful voltages or currents from being applied to the sensitive device being protected. In the depicted embodiment, the boundaries of the normal operation voltage window are determined by the forward voltage drop of one diode and the reverse breakdown voltage of the other diode. For instance, in the depicted example, if a positive voltage is applied between the first and second terminal connections 108, 110 that exceeds the forward conduction voltage of the first diode 102 and the reverse breakdown voltage of the second diode 104, the second diode 104 begins to operate in the reverse conduction region such that any overvoltage in excess of this value is clamped. The same occurs in the case of a negative voltage between the first and second terminal connections 108, 110, except that the operational state of the two devices is reversed. If the first and second diodes 102, 104 have identical parameters and consequently have identical forward and reverse conduction characteristics, the boundaries of the normal operation voltage window are identical in magnitude and opposite in polarity.

The first and second diodes 102, 104 are representative of one type of semiconductor device that can be incorporated into the overvoltage protection device 100. More generally, the overvoltage protection device 100 can be implemented by any pair of two terminal semiconductor devices with one way conduction characteristics that are arranged in an anti-serial configuration. The boundaries of the normal operation voltage window are determined by the onset of conduction for negative voltages of one semiconductor device and positive voltages of the other semiconductor device. Examples of other types of semiconductor devices that may be substituted for the first and second diodes 102, 104 include bipolar transistors with floating or shorted base regions, devices with multiple p-n junctions in series such as silicon-controlled rectifier devices (SCRs), and devices with multiple different devices connected in parallel (e.g., combined diode and thyristor devices). An overvoltage protection device 100 comprising any of these semiconductor device types can include an additional capacitance 130 that is configured to compensate for a self-capacitance 125 of the conductive link 126 according to the concepts to be described in further below.

Figure 2:
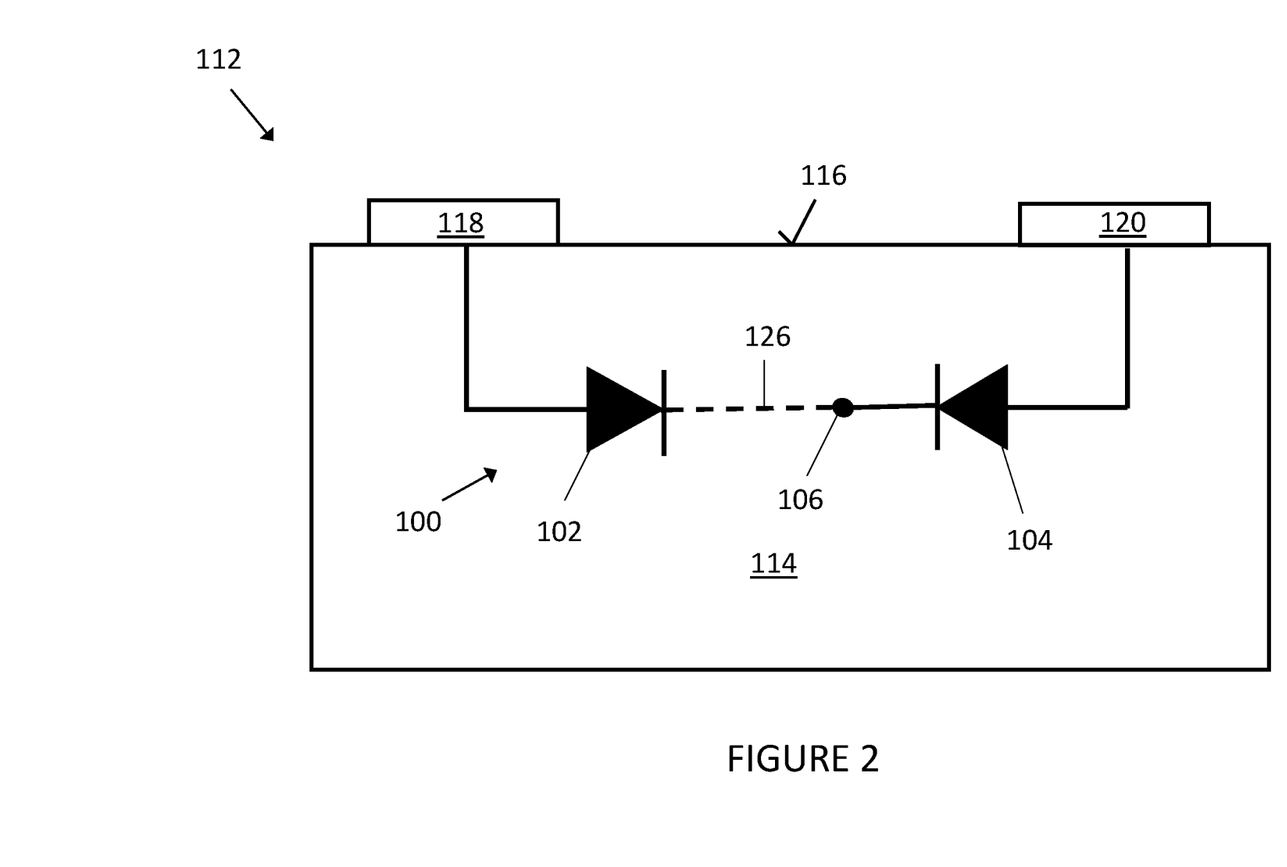
FIG. 2 illustrates a schematic of an overvoltage protection device integrally formed in a semiconductor die, according to an embodiment.

Referring to FIG. 2, an example of a discrete semiconductor die 112 that includes the overvoltage protection device 100 is depicted, according to an embodiment. The semiconductor die 112 includes a semiconductor body 114 with a main surface 116. Generally speaking, the semiconductor body 114 may include any of a wide variety of semiconductors that are commonly used to form semiconductor devices. Examples of these materials include type IV semiconductor materials, e.g., silicon (Si), sapphire, carbide (SiC), silicon germanium (SiGe), etc. and type III-V semiconductor materials, e.g., gallium nitride (GaN), gallium arsenide (GaAs), aluminium gallium nitride (AlGaN), indium gallium nitride (InGaN), aluminium gallium arsenide (AlGaAs), etc.

The first and second diodes 102, 104 of the overvoltage protection device 100 are monolithically integrated into the semiconductor body 114 of the semiconductor die 112. The characteristics of the first and second diodes 102, 104, e.g. capacitance, reverse breakdown voltage, forward conduction voltage, maximum voltage rating, etc., can be tailored through adjustment of physical parameters (e.g., dopant concentration, material type, size, etc.) of the anode and cathode regions of these diodes. In an embodiment, the first and second diodes 102, 104 are configured as avalanche diodes, which refers to a particular type of diode with a defined reverse breakdown voltage that is predominately determined by the avalanche effect. In another embodiment, the first and second diodes 102, 104 are configured as Zener diodes, which refers to a particular type of diode with a defined reverse breakdown voltage that is predominately determined by the tunnel effect. The reverse breakdown voltage of these diodes may be on the order of −2V, −5V, −10V, −20V, etc., for example.

The semiconductor die 112 includes first and second metal electrodes 118, 120 disposed on the main surface 116 of the semiconductor body 114. The first and second metal electrodes 118, 120 are electrically conductive structures formed from a conductive metallization that may comprise or be plated with copper, aluminium, silver, nickel, tin, gold, etc., and alloys thereof. In the depicted embodiment, the first and second metal electrodes 118, 120 are externally accessible contact pads that provide the first and second terminal connections 108, 110 are configured as planar bond pads that are designed to interface with an interconnect structure or other bonding surface. Alternatively, the first and second metal electrodes 118, 120 can be electrode or pin structures that can be bonded or soldered to another structure. The first metal electrode 118 is conductively connected to the terminal of the first diode 102 opposite from the central node 106 (the anode in the depicted embodiment) and the second metal electrode 120 is conductively connected to the terminal of the second diode 104 opposite from the central node 106 (the anode in the depicted embodiment). These conductive connections can be provided by interconnect lines that are integrally formed in the semiconductor body 114, e.g., metal or polysilicon interconnect lines. Alternatively, these conductive connections can be provided by a direct connection between the first metal electrode 118 and the terminal of the first diode 102 opposite from the central node 106 and a direct connection between the second metal electrode 120 and the terminal of the second diode 104 opposite from the central node 106 second metal electrode.

The like terminals of the first and second diodes 102, 104 that are connected to one another (the cathodes in the depicted embodiment) are connected by a conductive link 126. This conductive link 126 may be provided by interconnect lines that are integrally formed in the semiconductor body 114, e.g., metal or polysilicon interconnect lines. Alternatively, this conductive link 126 may be a doped semiconductor region, e.g., in the case that the first and second diodes 102, 104 share a common doped region (e.g., cathode or anode in the case of a diode) as one of their terminals.

Figure 3:
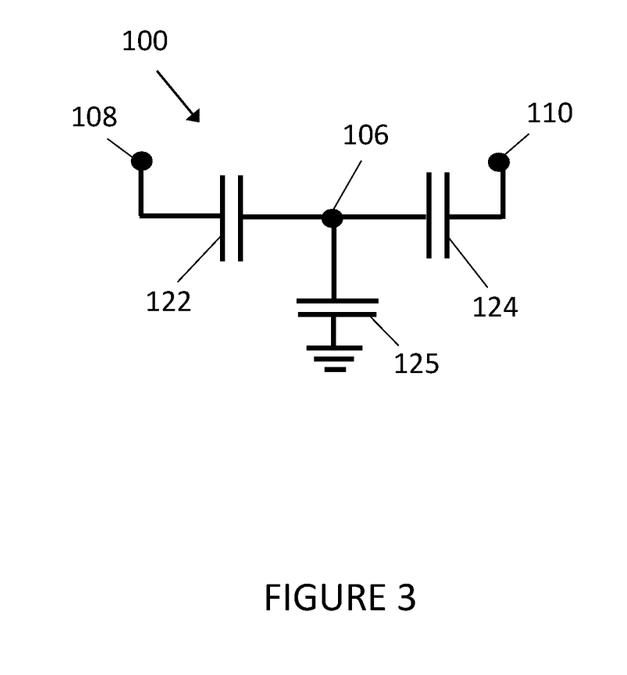
FIG. 3 illustrates a capacitance equivalent schematic of an overvoltage protection device in a disconnected state, according to an embodiment.

Referring to FIG. 3, a schematic of certain parasitic capacitances of the overvoltage protection device 100 is depicted. These parasitic capacitances include an inherent capacitance 122 of the first diode 102 and an inherent capacitance 124 of the second diode 104. The inherent capacitances 122, 124 of the first and second diodes include the junction capacitance and the diffusion capacitance of these diodes, which are voltage dependent characteristics, and interconnect related capacitances, such as pad to substrate capacitances, metal interconnect to substrate and interconnect to interconnect capacitances. Additionally, the parasitic capacitances of the overvoltage protection device 100 include the self-capacitance 125 of the conductive link 126. As the conductive link 126 is an electrical conductor, it has a certain charge storage capability vs. a reference potential. The self-capacitance is a function of e.g. the geometry of the conductive link 126 and permittivity of the material surrounding of the conductive link. In one exemplary wafer-level-package device embodiment in which the conductive link consists of a body of silicon with dimensions in the 100s of μm range, the self-capacitance 125 of the conductive link 126 is in the range of 5-50 fF (femtofarads).

Figure 4:
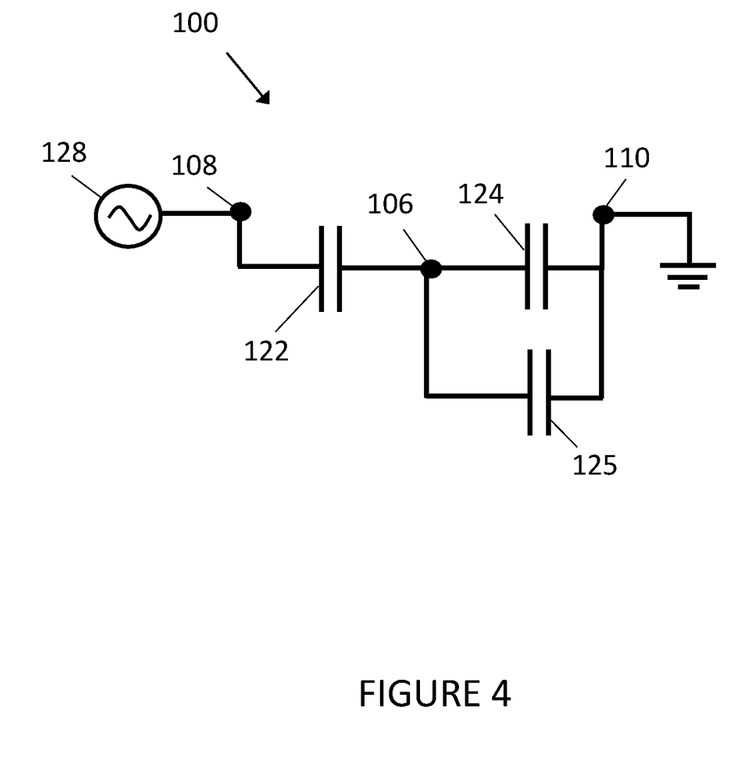
FIG. 4 illustrates a capacitance equivalent schematic of an overvoltage protection device when the device is connected to an AC signal in an overvoltage protection arrangement, according to an embodiment.

Referring to FIG. 4, a schematic of certain parasitic capacitances of the overvoltage protection device 100 is depicted with the overvoltage protection device 100 connected in a circuit protection arrangement. In this exemplary arrangement, an AC signal 128 is applied to the first terminal connection 108 and the second terminal connection 110 is grounded. Generally speaking, the frequency of the AC signal 128 can be any value that is used in electronics applications. In one particular example, the overvoltage protection device 100 can be implemented in an RF telecommunications application, e.g., 4G, 5G, etc. In that case, the frequency of the signal at the first terminal connection 108 can be in typical RF spectrums associated with these applications, e.g., 800 MHz-2700 MHz in the case of 4G, 450 MHz-6+ GHz in the case of 5G. The sensitive device which receives or supplies the AC signal 128 can be or comprise an electrical element, such as an antenna, amplifier, transceiver, antenna switch, etc.

In the circuit protection arrangement wherein an AC signal 128 is applied to the first terminal connection 108 and the second terminal connection 110 is connected to ground, the TVS device will generate no even order harmonics (i.e., $2^{nd}$ order, fourth order, etc.), when there is symmetry with respect to the central node 106. In this context, symmetry means that the capacitive effect of elements in a first transmission path between the first terminal connection 108 and the central node 106 match the capacitive effects of elements in a second transmission path between the second terminal connection 110 and the central node 106. The first transmission path includes the inherent capacitance 122 of the first diode 102. The second transmission path includes the inherent capacitance 124 of the second diode 104. Although these two capacitances 122, 124 are voltage dependent, they always substantially match one another in the case of two identical devices in an anti-serial configuration. Thus, the parasitic capacitances associated with the first and second diodes 102, 104 are symmetric with respect to the central node 106 and in the ideal case generate no even order harmonic distortion products (or spurious signals).

However, the self-capacitance 125 of the conductive link 126 gives rise to an asymmetry in the circuit, because it is effectively in parallel with the inherent capacitance 124 of the second diode 104. Thus, the total capacitance of elements in the second transmission path that is between the second terminal connection 110 and the central node 106 is greater than the total capacitance of elements in the first transmission path that is between the first terminal connection 108 and the central node 106.

Figure 5:
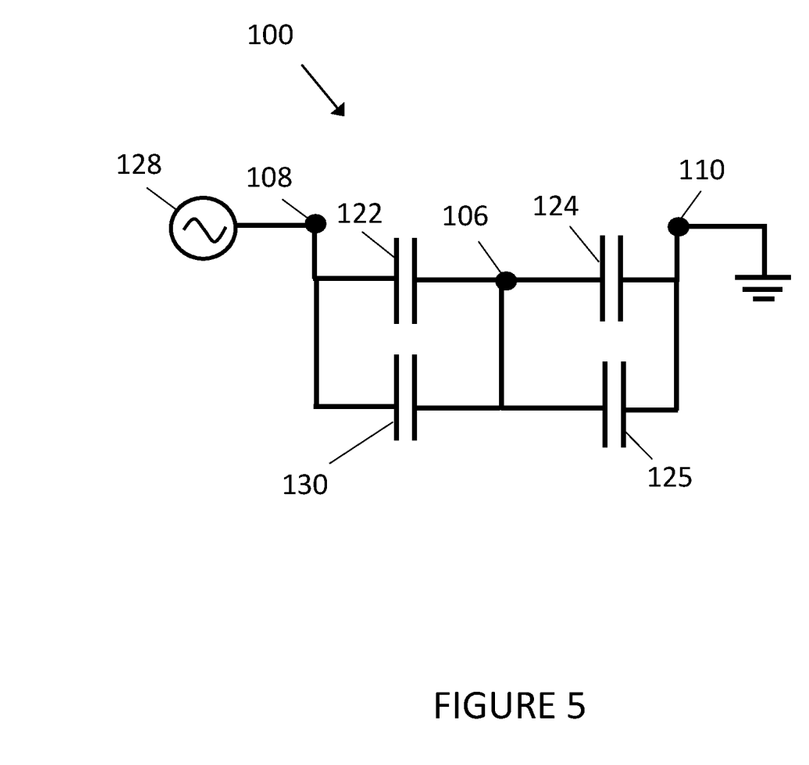
FIG. 5 illustrates a capacitance equivalent schematic of an overvoltage protection device when the device is connected to an AC signal in an overvoltage protection arrangement and includes a compensating capacitance, according to an embodiment.

Referring to FIG. 5, the overvoltage protection device 100 has the identical configuration as described above except that it additionally includes an additional capacitance 130 in the first transmission path. The magnitude of the additional capacitance 130 substantially matches magnitude of the self-capacitance 125 of the conductive link 126. Thus, the symmetry of the circuit with respect to the central node 106 has been restored. That is, the total capacitance of elements in the first transmission path that is between the first terminal connection 108 and the central node 106 is substantially equal to the total capacitance of elements in the second transmission path that is between the central node second terminal connection 110 and the central node 106. As a result, the even order harmonic distortion of the circuit is substantially mitigated. In practice, the level of $2^{nd}$ harmonics can be reduced by more than 20 dB, or more than 12 dB, or more than 6 dB compared to an equal reference TVS device in which the additional capacitance is not implemented. While the additional capacitance 130 is shown as being an element of the first transmission path, the compensation concept described herein can be obtained by introducing any asymmetry as between the features which form the first and second transmission paths so that there is a net difference in capacitance, which can equivalently be represented as the additional capacitance 130. This net difference in capacitance can be used to compensate for a discrepancy in symmetry as between the first and second transmission paths that is attributable to parasitic effects, such as the self-capacitance 125 of the conductive link 126.

According to an embodiment, the additional capacitance 130 is provided by a monolithically formed feature in a semiconductor die. Generally speaking, this monolithically integrated feature can include any combination of metal, semiconductor or insulating structures which can be geometrically structured to produce a defined and predictable capacitance using known relationships. These features may be formed by standard semiconductor processing techniques, e.g., deposition, oxidation, etching, photolithography etc., to achieve a desired geometry. The additional capacitance 130 can be monolithically integrated into the same semiconductor die 112 as the first and second diodes 102, 104. Alternatively, the first and second diodes 102, 104 can be disposed in separate dies and provided in a common package (e.g. lead frame, laminate, etc.), with the additional capacitance 130 being monolithically integrated in one of these separate dies. Alternatively, the additional capacitance 130 can be provided by a separate semiconductor die that is not monolithically formed in the same die as one or both of the first and second diodes 102, 104.

Referring to FIG. 6, an embodiment wherein the additional capacitance 130 is provided from a geometric difference in the one or more sections of metal which are part of the first and second transmission paths is depicted. In this example, the geometric difference includes a size difference between the first and second metal electrodes 118, 120. The first and second metal electrodes 118, 120 each contribute a defined capacitance between the electrodes 118, 120 and a conductive body that is connected to the central node 106, that is dependent upon the area of the bond pad and the dielectric constant of material between the pad and the body of the central node. In the typical case of two identically sized bond pads, these capacitances are equal in magnitude and thus not contribute to the asymmetry of the circuit with respect to the central node 106. However, if the first metal electrode 118 is made to be larger than the second metal electrode 120, there is an asymmetry in pad capacitance which can be represented as the additional capacitance 130 described with reference to FIG. 4.

Figure 6A:
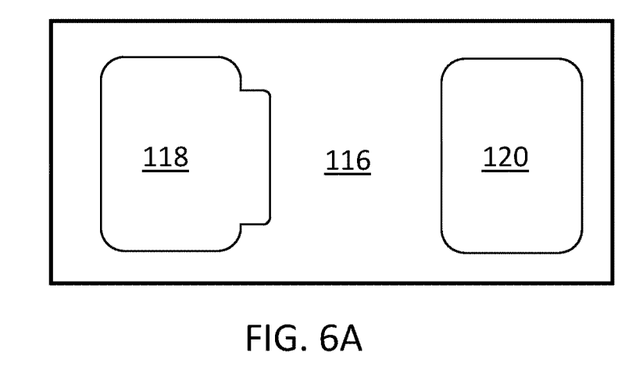
FIGS. 6A, 6B and 6C, illustrates several different embodiments of geometric alterations to electrodes that create the compensating capacitance, according to an embodiment.
Figure 6B:
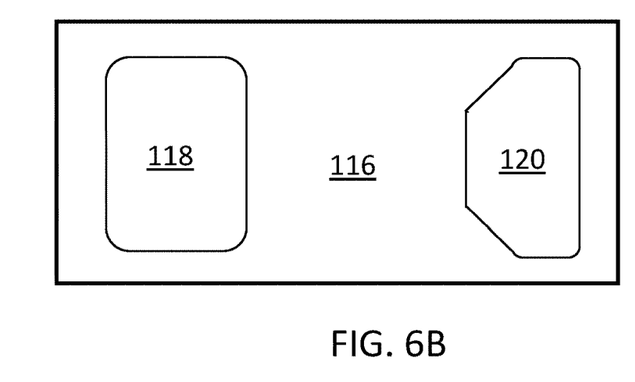
Figure 6C:
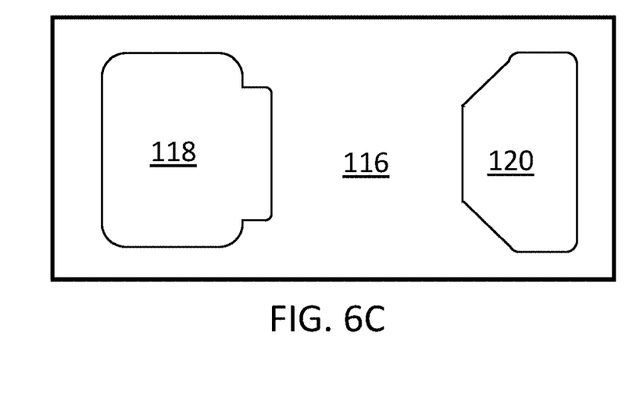

In the example of FIG. 6A, the first and second metal electrodes 118, 120 each include a generally rectangular section of identical size, but the first metal electrode 118 is enlarged by an additional section which adds capacitance. In the example of FIG. 6B, the first metal electrode 118 has a generally rectangular shape while the second metal electrode 120 has sections eliminated from this generally rectangular shape to reduce its area. In the example of FIG. 6C, both concepts are combined. In any case, the capacitance of the first metal electrode 118 and the central node 106 is greater than the capacitance of the second metal electrode 120 and the central node 106. More generally, any of a variety of different geometries can be selected to produce a desired size difference.

According to an embodiment, the size difference between the first and second metal electrodes 118, 120 is such that the pad capacitance of the first metal electrode 118 is greater than the pad capacitance of the second metal electrode 120 by an amount equal to the additional capacitance 130. In this way, the parasitic impact of the conductive link 126 can be completely compensated for by the structuring of the bond pads. Using an exemplary copper bond pad metallization formed over a 5 μm thick silicon dioxide passivation layer as an example, the pad capacitance of each bond pad is equal to about 7-8 aF (attofarad)/μm$^2$. If, for instance, the self-capacitance 125 of the conductive link 126 is in the range of 5-50 fF, this means that an areal difference of approximately 1,000 μm$^2$-7,000 μm$^2$ can be used to match the self-capacitance 125 of the conductive link 126. Instead of adjusting the size of the first and second metal electrodes 118, 120, a similar concept may be employed to adjust the properties of the subjacent dielectric material. For example, the dielectric material underneath the first and second metal electrodes 118, 120 may have a difference in thickness or material type to obtain a difference in pad capacitance.

Figure 7:
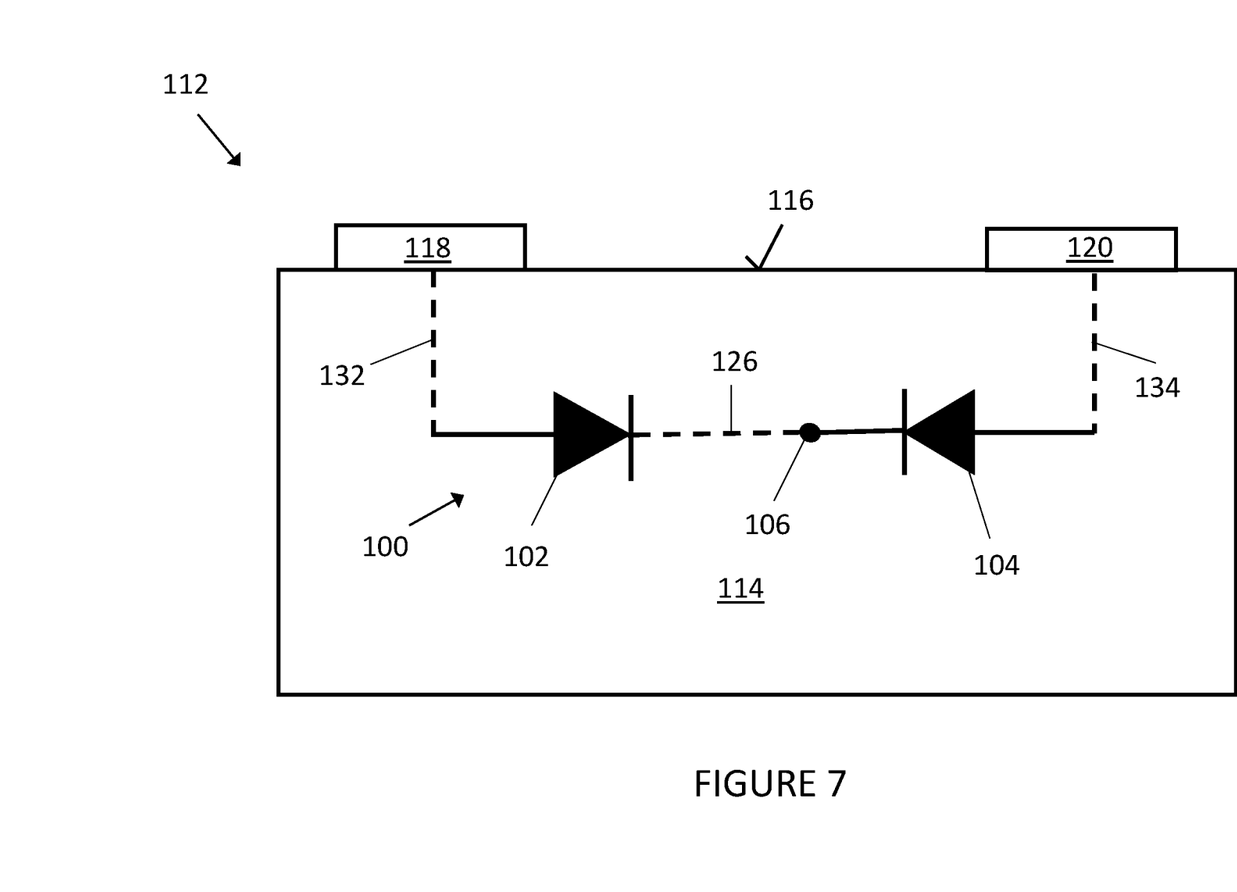
FIG. 7 illustrates a schematic of a semiconductor die wherein the compensating capacitance is introduced into an interconnect line formed in the semiconductor die, according to an embodiment.

Referring to FIG. 7 another embodiment is depicted wherein the additional capacitance 130 is provided from a geometric difference in the sections of metal which form part of the first and second transmission paths. In this embodiment, the difference in geometry is incorporated into first and second interconnect lines 132, 134 (e.g., structured metal or polysilicon tracks) that respectively connect the first and second metal electrodes 118, 120 to the first and second diodes 102, 104. The geometry of the first and second interconnect lines 132, 134 may be altered in a similar manner as described above such that the capacitance between the first interconnect line 132 and the central node 106 is greater than the capacitance of the second interconnect line 134 and the central node 106. For instance, the first interconnect line 132 can have a greater width and/or length as the second interconnect line 134 to create a difference in capacitance. Alternatively, the capacitance of the interconnect lines may be altered by changing the thickness of the insulating layers between the interconnect lines 132, 134 and the conductive link 126/central node 106. Moreover, this technique can be combined with the bond pad sizing technique as described above.

Figure 8:
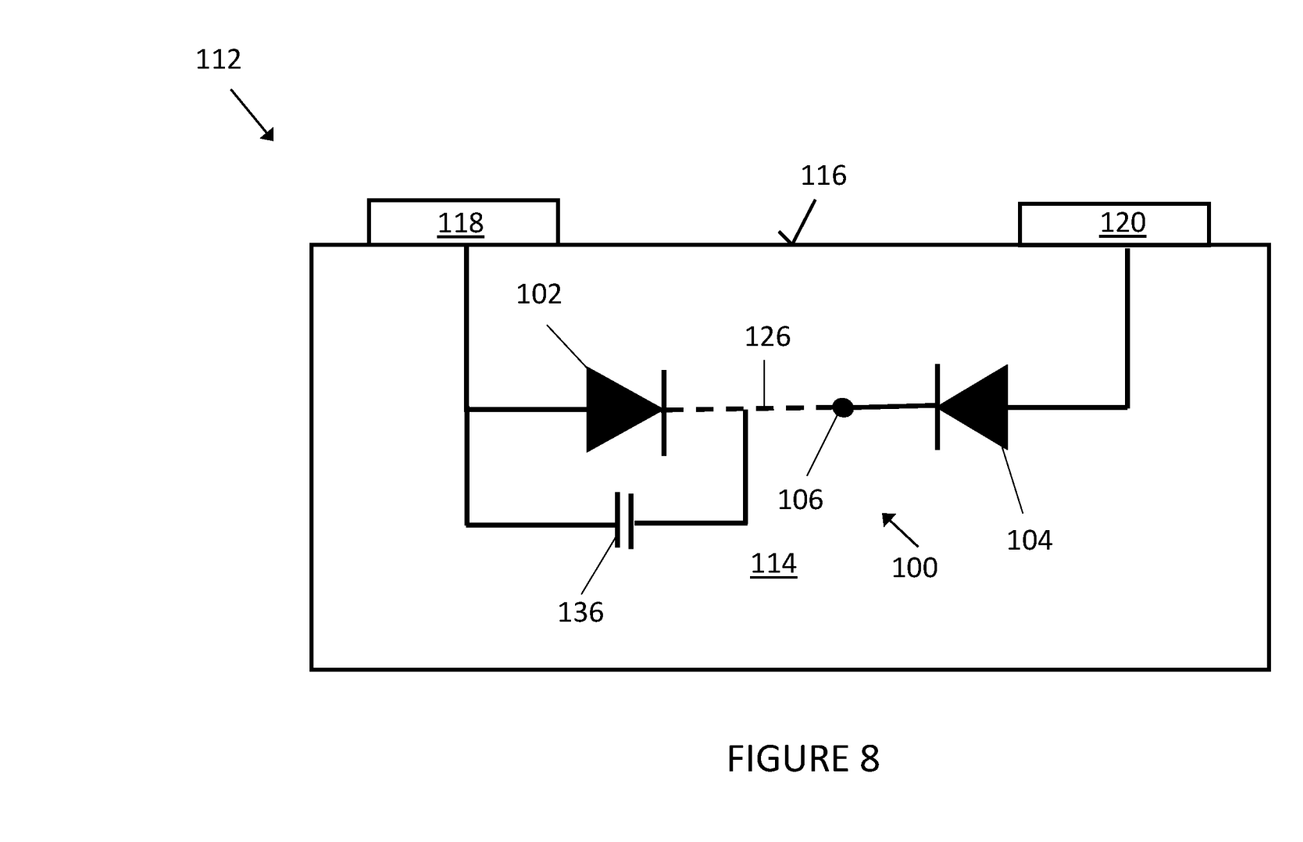
FIG. 8 illustrates a schematic of a semiconductor die wherein the compensating capacitance is provided by an additional capacitor structure that is monolithically integrated in the semiconductor die, according to an embodiment.

Referring to FIG. 8, another example of an overvoltage protection device 100 is depicted wherein the additional capacitance 130 is provided from a monolithically integrated feature in the semiconductor body 114 other than the conductive link 126. In this embodiment, the monolithically integrated feature is provided by a dielectric-based or semiconductor-based capacitor structure 136 that is separate from the first diode 102 and connected between the first terminal and the central node 106. Examples of dielectric-based capacitor structures include metal-insulator-metal (MIM) capacitors and metal-oxide-semiconductor (MOS) capacitors. In these examples, the capacitor structure 136 can include a parallel plate configuration with a metal pad and a dielectric material (e.g., silicon dioxide, silicon nitride, etc.) providing a dielectric medium. Another example of a dielectric-based capacitor structure 136 is a trench capacitor. In this example, an electrically conductive material (e.g., polysilicon, tungsten, etc.) and a dielectric material (e.g., silicon dioxide, silicon nitride, etc) are disposed in the trench. Examples of semiconductor-based capacitor structures include p-n junction structures (separate from the first diode 102) which provide a defined junction capacitance.

In yet another embodiment, the monolithically integrated feature of the semiconductor die 112 which provides the additional capacitance 130 is the first diode 102 itself. As previously explained, the inherent capacitance of a diode depends upon geometric parameters such as dopant concentration, size, material, etc. By creating an intentional difference in adjustable parameters such as device area, the inherent capacitance 122 of the first diode 102 can be made greater than the inherent capacitance 124 of the second diode 104. Thus, the additional capacitance 130 which compensates for the self-capacitance 125 of the conductive link 126 is provided directly through sizing of the first diode 102, and no additional features other than asymmetric geometric modification of the TVS device structure itself is needed. One drawback of this technique is that it may increase odd order harmonic distortion since the capacitance of the first and second diodes 102, 104 is voltage dependent and a substantially linear self-capacitance 125 is balanced by the increased portion of diode 102 which is voltage dependent. However, if the compromise between the positive impact on the even harmonics and negative impact on the odd harmonics is advantageous or acceptable, this concept may represent a viable technique for forming the additional capacitance 130.

In the above discussion, the overvoltage protection device 100 is implemented in a single semiconductor die 112 as a discrete device. In other embodiments, the overvoltage protection device 100 may be implemented in two separate dies which provide the first and second diodes 102, 104. In that case, the conductive link 126 may be provided by a metal interconnect structure such as a bond wire or clip. Any one or more of the concepts described herein may be applied to introduce an additional capacitance 130 into the circuit which partially or completely matches the conductive link 126 to restore symmetry in the circuit. In addition or in the alternative, corresponding concepts may be employed in semiconductor dies which include multiple anti-serial connected diodes in parallel with one another In another example, corresponding concepts may be employed in arrangements with multiple parallel diode arrangements respectively connected in an anti-serial arrangement, i.e., an anti-serial connected arrangement that includes multiple parallel diode paths.

Figure 9:
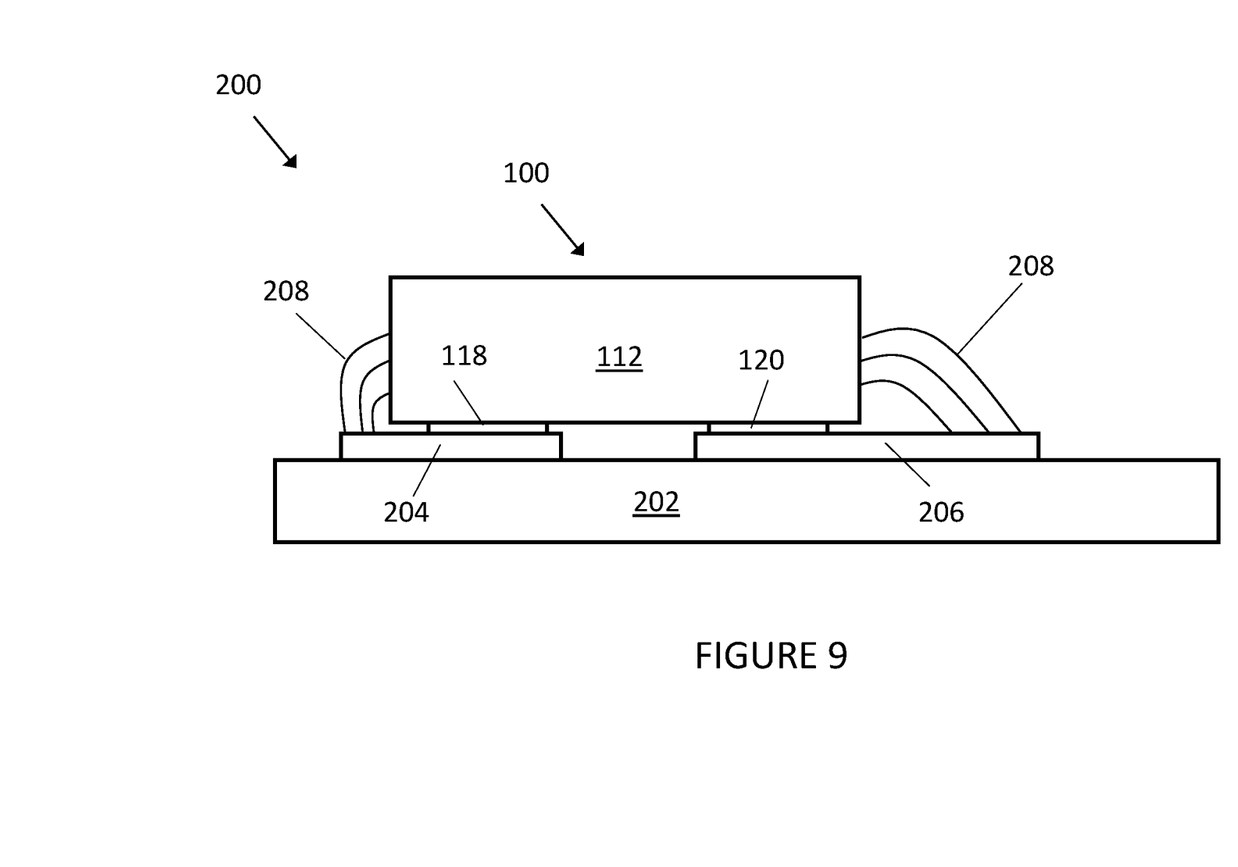
FIG. 9 illustrates an assembly with an overvoltage protection device mounted on a circuit carrier, according to an embodiment.

Referring to FIG. 9, semiconductor assembly 200 is depicted, according to an embodiment. The semiconductor assembly 200 comprises a circuit carrier 202. The circuit carrier 202 can be any structure that accommodates the mounting of one or more semiconductor dies thereon. Examples of these structures include PCBs (printed circuit boards), and power module substrates such as IMS (isolated metal substrate) substrates, DCB (direct copper bonding) substrates and AMB (active metal brazed) substrates. The circuit carrier comprises first and second planar die mounting pads 204, 206, which may be formed from a structured layer of metal, e.g., Cu, Al, etc., and alloys thereof.

The semiconductor assembly 200 further comprises an overvoltage protection device 100 mounted on the circuit carrier 202. As depicted, the overvoltage protection device 100 is implemented in a single semiconductor die 112. The semiconductor die 112 is mounted such that the first metal electrode 118 is attached and electrically connected to the first planar die mounting pad 204 and such that the second metal electrode 120 is attached and electrically connected to the second planar die mounting pad 206. These connections may be effectuated by a conductive adhesive material, e.g., solder, sinter, conductive glue, etc.

According to an embodiment, the conductive connections of the circuit carrier 202 to the first metal electrode 118 and the second metal electrode 120 are asymmetric. This means that the conductive portions of the circuit carrier 202 associated with the node of the first planar die mounting pad 204 are different from the conductive portions of the circuit carrier 202 associated with the node of the second planar die mounting pad 206. That is, the metal areas associated with the first planar die mounting pad 204 (e.g., metal interconnect lines, or ground planes or supply lines attached to the mounting pads) are different from the metal areas associated with the second planar die mounting pad 206. This creates an asymmetry in the electric field lines 208 around the connection points of the overvoltage protection device 100. FIG. 9 also depicts additional electric field lines 209 associated with the self-capacitance 125 of the conductive link 126.

Figure 10:
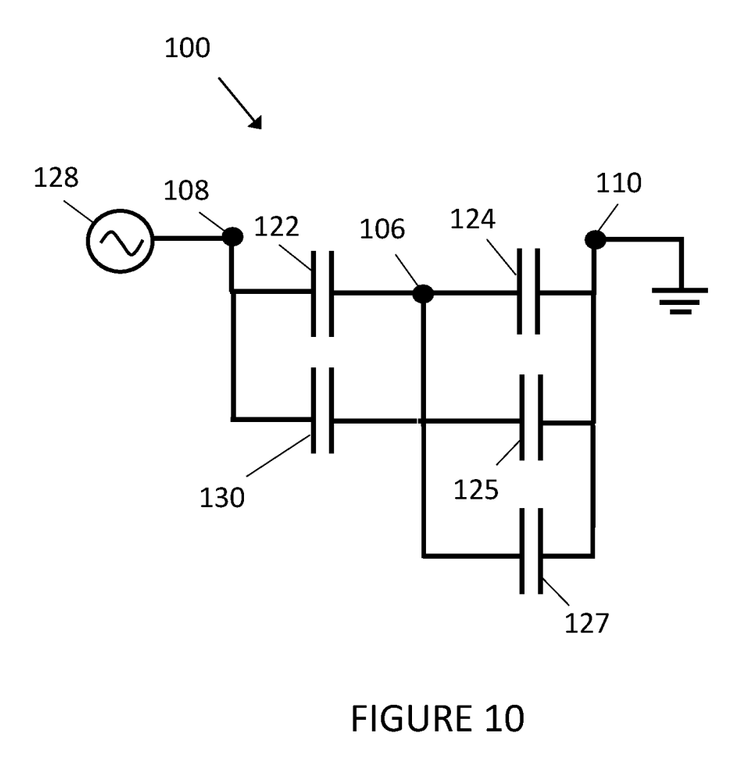
FIG. 10 illustrates a capacitance equivalent schematic of an assembly with an overvoltage protection device mounted on a circuit carrier.

Referring to FIG. 10, a schematic of capacitances of the overvoltage protection device 100 when mounted on the circuit carrier is depicted. In this configuration, the first terminal connection 108 is extended out to include the first planar die mounting pad 204 and associated conductive connections the second terminal connection 110 is extended out to include the second planar die mounting pad 206 and associated conductive connections. Thus, the circuit is similar to that described with respect to FIG. 5, except that it additionally accounts for the capacitive effect of the circuit carrier 202 in the first and second transmission paths, respectively.

The asymmetric conductive connections of the circuit carrier 202 to the first metal electrode 118 and the second metal electrode 120 results in a fourth net capacitance 127 that contributes to a total capacitance of the second transmission path during operation of the overvoltage protection device 100. The fourth net capacitance 127 represents the cumulative effect of the asymmetric distribution of electric field lines between the mounted device and the circuit carrier, as described above.

According to an embodiment, the additional capacitance 130 is greater than the self-capacitance of the conductive link. As a result, the additional capacitance 130 compensates for the contribution of both self-capacitance 125 of the conductive link 126 and the asymmetric conductive connection of the circuit carrier 202. In one specific embodiment, the additional capacitance 130 substantially matches a sum of the self-capacitance 125 of the conductive link 126 and the fourth net capacitance 127. In this way, symmetry between the first and second transmission paths can be completely restored.

In the depicted embodiment of FIG. 9, the overvoltage protection device is configured as a single semiconductor die 112 that comprises first and second semiconductor devices monolithically integrated therein. In that case, the additional capacitance 130 can be a monolithically integrated feature of this semiconductor die 112 formed according to any of the previously described embodiments. In another embodiment, the overvoltage protection device 100 comprises a first semiconductor die that comprises the first semiconductor device monolithically integrated therein, and a second semiconductor die that comprises the semiconductor device monolithically integrated therein. That is, the overvoltage protection device 100 can be provided by two separate dies mounted on and attached to the first and second planar die mounting pads 204, 206 respectively. In that case, the conductive link 126 can be provided by a board level interconnection, e.g., conductive trace, wire bond, clip, etc. In that case, the additional capacitance 130 can be a monolithically integrated feature of the first or second semiconductor die that is obtained according to any of the previously described techniques. Alternatively, the additional capacitance 130 can be provided by a separate discrete capacitor that is mounted on the circuit carrier 202 and incorporated into the first transmission path, or by a capacitor formed between different metal structures or metal lines of the circuit carrier.

The term "substantially" as used herein encompasses absolute conformity with the specified requirement as well as minor deviations from absolute conformity with the requirement due to manufacturing process tolerance window. For example, the capacitances of two capacitor structures "substantially" match when the geometric features of these capacitor structures which contribute to capacitance are designed to identical targets, and deviate from one another no more than the acceptable process window (e.g., within +/−3% total area, doping, etc.)

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention is limited only by the claims and the equivalents thereof.

What is claimed is:

1. An overvoltage protection device, comprising:
   first and second semiconductor devices arranged in an anti-serial configuration, the first and second semiconductor devices each being two terminal semiconductor devices with one way conduction characteristics;

a conductive link that forms a complete electrical connection between an internal terminal of the first semiconductor device and an internal terminal of the second semiconductor device at a central node of the overvoltage protection device;

a first terminal connection to a terminal of the first semiconductor device that is opposite from the internal terminal of the first semiconductor device;

a second terminal connection to a terminal of the second semiconductor device that is opposite from the internal terminal of the first semiconductor device;

wherein a total capacitance a first transmission path that is between the first terminal connection and the central node substantially matches a total capacitance of a second transmission path that is between the second terminal connection and the central node, and wherein an entire self-capacitance of the conductive link is included in the total capacitance of the second transmission path.

2. The overvoltage protection device of claim 1, wherein an inherent capacitance of the second semiconductor device is included in the total capacitance of the second transmission path, and wherein an inherent capacitance of the first semiconductor device is included in the total capacitance of the first transmission path.

3. The overvoltage protection device of claim 2, wherein the inherent capacitance of the first semiconductor device substantially matches the inherent capacitance of the second semiconductor device, wherein the overvoltage protection device further comprises an additional capacitance in the first transmission path, and wherein the additional capacitance substantially matches the self-capacitance of the conductive link.

4. The overvoltage protection device of claim 3, wherein the first and second semiconductor devices and the additional capacitance are each monolithically integrated in a semiconductor die.

5. The overvoltage protection device of claim 4, wherein the first transmission path comprises one or more sections of conductive material, wherein the second transmission path comprises one or more sections of conductive material, and wherein the additional capacitance is provided by a geometric difference between the one or more sections of conductive material from the first transmission path and the one or more sections of conductive material from the second transmission path.

6. The overvoltage protection device of claim 5, wherein the one or more sections of metallization from the first transmission path comprise a first metal electrode that is disposed on a surface of the semiconductor die, wherein the one or more sections of metallization from the second transmission path comprise a second metal electrode that is disposed on a surface of the semiconductor die, and wherein the geometric difference comprises a size difference between the first and second metal electrodes.

7. The overvoltage protection device of claim 6, wherein the size difference between the first and second metal electrodes is such that a pad capacitance of the first metal electrode between the first electrode and the central node is greater than a pad capacitance of the second metal electrode between the second electrode and the central node by an amount equal to the additional capacitance.

8. The overvoltage protection device of claim 6, wherein the one or more sections of metallization from the first transmission path comprise a first interconnect line that is formed within the semiconductor die, wherein the one or more sections of metallization from the second transmission path comprise a second interconnect line that is formed within the semiconductor die, and wherein the geometric difference comprises a difference in geometry between the first and second interconnect lines.

9. The overvoltage protection device of claim 3, wherein the additional capacitance is a dielectric-based or semiconductor-based capacitor structure that is separate from the first semiconductor device and connected between the first terminal and the central node.

10. The overvoltage protection device of claim 2, wherein the inherent capacitance of the first semiconductor device is greater than the inherent capacitance of the second semiconductor device by an amount equal to the self-capacitance of the conductive link.

11. The overvoltage protection device of claim 1, wherein the internal terminals of the first and second semiconductor devices are exclusively electrically connected to one another.

* * * * *

UNITED STATES PATENT AND TRADEMARK OFFICE
CERTIFICATE OF CORRECTION

PATENT NO. : 11,936,178 B2
APPLICATION NO. : 17/027226
DATED : March 19, 2024
INVENTOR(S) : E. Tylaite et al.

It is certified that error appears in the above-identified patent and that said Letters Patent is hereby corrected as shown below:

In the Claims

Column 13, Line 14 (Claim 1) please change "capacitance a" to -- capacitance of a --

Signed and Sealed this
Seventh Day of May, 2024

Katherine Kelly Vidal
*Director of the United States Patent and Trademark Office*